(12) United States Patent
Bickford

(10) Patent No.: US 6,205,324 B1
(45) Date of Patent: Mar. 20, 2001

(54) BROADBAND DOUBLE-BALANCED FREQUENCY MIXER

(75) Inventor: Joel David Bickford, Santa Rosa, CA (US)

(73) Assignee: Agilent Technologies Inc., Palo Alto, CA (US)

( * ) Notice: Subject to any disclaimer, the term of this patent is extended or adjusted under 35 U.S.C. 154(b) by 0 days.

(21) Appl. No.: 09/240,000

(22) Filed: Jan. 29, 1999

(51) Int. Cl.[7] ....................................... H04B 1/26
(52) U.S. Cl. ..................... 455/331; 455/318; 455/319; 455/323; 455/325; 455/326; 455/330
(58) Field of Search ....................... 455/331, 318, 455/323, 325, 326, 330; 327/113

(56) References Cited

U.S. PATENT DOCUMENTS

| | | | | |
|---|---|---|---|---|
| 3,665,508 | * | 5/1972 | Gawler | 455/331 |
| 4,035,732 | * | 7/1977 | Lohrmann | 455/320 |
| 4,230,956 | * | 10/1980 | Steinbrecher | 327/122 |
| 5,280,649 | * | 1/1994 | Riebman | 455/326 |
| 5,553,319 | * | 9/1996 | Tanabakuchi | 455/326 |

* cited by examiner

*Primary Examiner*—Dwayne Bost
*Assistant Examiner*—Temica M. Davis

(57) ABSTRACT

The invention provides a broadband double-balanced mixer capable of operating across a range of frequencies from millimeter to microwave. The mixer includes a Wilkinson type splitter.

5 Claims, 3 Drawing Sheets

BROADBAND DOUBLE-BALANCED FREQUENCY MIXER

FIELD OF THE INVENTION

The invention relates to frequency conversion devices, such devices commonly known as mixers, and, in particular, broadband double-balanced mixers.

BACKGROUND OF THE INVENTION

A mixer is a device that converts signals from one frequency to another. This is accomplished by applying a local oscillator (LO) reference signal to one of the mixer ports, and the signal to be converted to a second mixer port. The sum and difference frequencies of the two signals are predominantly what appear at the mixer output port, although the sum and difference frequencies of the harmonics of the two input frequencies also co-exist on the mixer output port as well. For transmitter applications, a low frequency signal is first processed (or modulated) and then up converted through a mixer to a microwave frequency, where it is usually amplified and transmitted. For receiver applications, the received signal is down converted through a mixer to a low frequency where the information is extracted (demodulated).

The diode, a non-linear device, creates the mixing action in a mixer. Diodes, the simplest kind of semiconductor, consisting simply of a package with two leads, permit current flow in one direction only. Like any semi-conductor, a diode is capable of handling only a limited amount of input signal power before it saturates.

A mixer's dynamic range is the input power range over which a mixer is usable. On the low input power end, it is limited by the noise figure and other system parameters such as signal to-noise ratio and receiver bandwidth. On the high end it is limited by either the saturation level or the input level for which certain spurious signals reach unacceptable levels.

To cover a broad range of frequencies, combinations of mixers have been used in order to get adequate coverage. This results in disadvantageous bulk and cost. Instrumentation design reflect a compelling tendency toward remote instrument heads. There is a need for a mixer capable of operating across broad RF and local oscillator frequency bandwidths to meet the design and performance requirements.

SUMMARY OF THE INVENTION

The invention provides a frequency conversion device operable across very broad RF and local oscillator frequency bandwidths.

The invention provides a broadband double-balanced mixer with improved performance and reliability at lower manufacturing cost and greatly reduced size and weight. The invention further provides a highly portable broadband mixer suitable for placement on a remote instrument head.

The invention provides an embodiment wherein the device design permits reducing the number of parts from more than 40 down to about 4, thereby eliminating the losses associated with a greater number of parts.

In the preferred embodiment, a Wilkinson-type splitter is positioned between the resistors and the RF source and functions to increase the parallel impedance across the diode at higher frequencies.

This configuration provides for the maintenance of even mode impedance Zoe of the splitter transmission lines at 2Rrf throughout its length. The splitter functions to increase the parallel impedance across the diodes from 2*R to 2*R+2*Z0o at higher frequencies where the divider is significantly longer than a quarter wavelength. Increased parallel impedance forces more local oscillator current through the diode, which means a weaker local oscillator drive signal can be used to produce equal diode switching currents. The splitter also provides a matched termination to any LO signal that passes the diode and resistors.

In an alternate embodiment of the invention, two balanced resistors replace a Wilkinson-type splitter. When R1=R2=R, the lowered impedance removes the lower frequency limit imposed by the Wilkinson-type splitter. The RF signal sees the resistors in parallel for a smaller effective series of resistance of R2 at all frequencies. The lowered resistance permits more RF energy to reach the diodes.

DETAILED DESCRIPTION OF THE PREFERRED EMBODIMENTS

Figure 1:
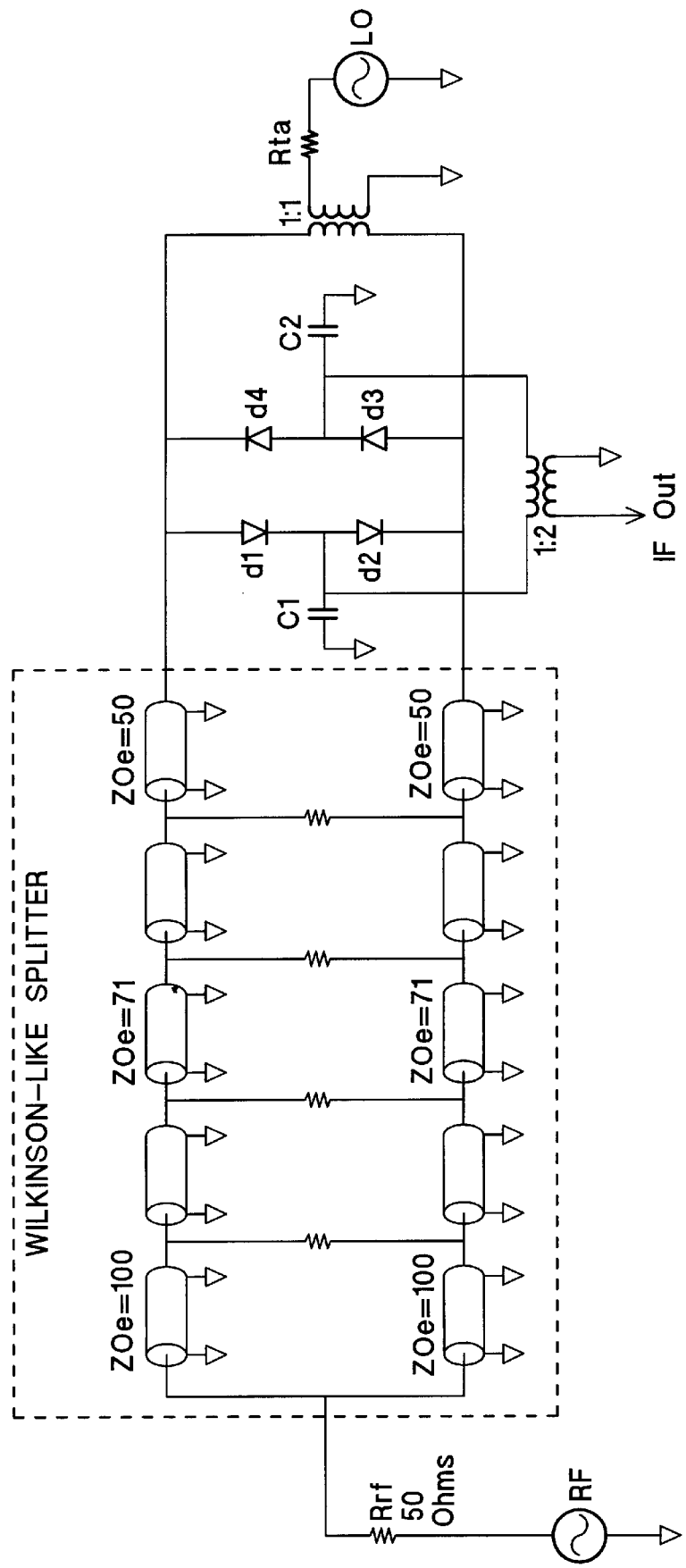
FIG. 1 schematically illustrates a prior art mixer.
Figure 2:
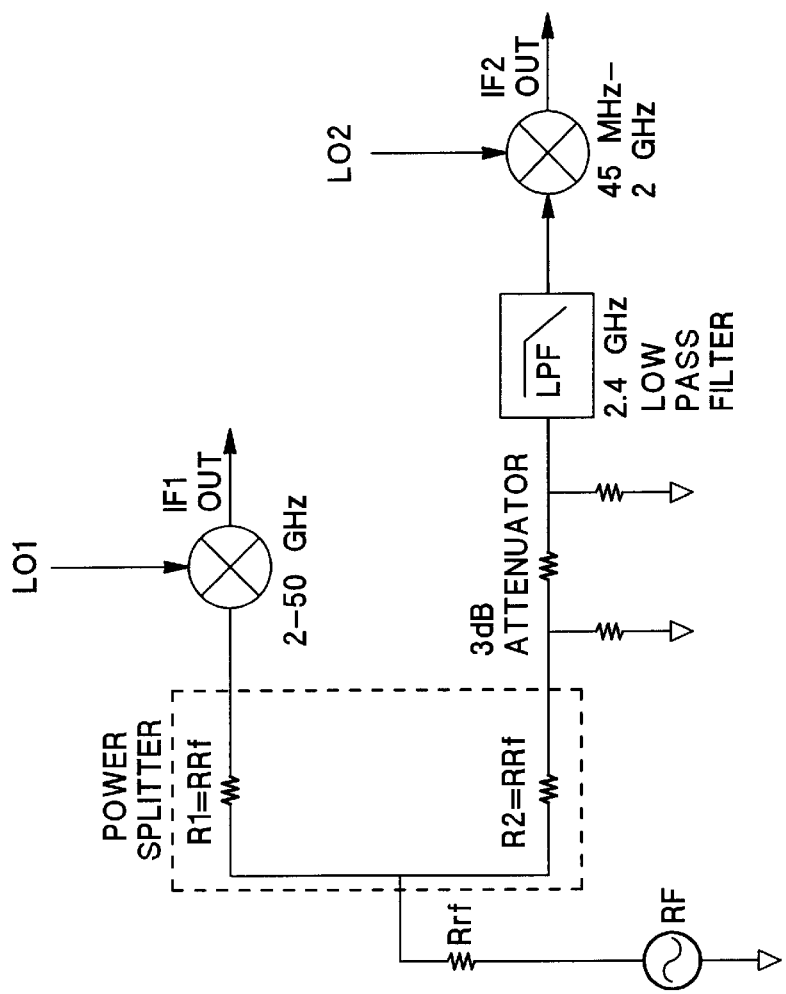
FIG. 2 schematically illustrates a prior art mixer.

Prior art mixers re schematically depicted in FIGS. 1 and 2. FIG. 1 depicts a mixer used in Hewlett-Packard's 2–50 GHz mixers 5086-7659 and 5087-7047. FIG. 2 depicts a simplified block diagram of the 45 megahertz to 50 gigahertz receivers in the 8510XF network analyzer. The RF signal coming in is split to the two mixers. This splitter adds more than 6 dB of loss to the RF signal hitting each mixer and reduces the sensitivity of the overall receiver by that amount. The lowband mixer is further attenuated by 3 dB to reduce the mismatch from the filter out of its passband. This configuration illustrates the added complexity and expense of two additional LO sources, as well as increased RF and IF filtering and switching which is not needed with this invention. This is particularly important for applications such as the 8510 XF in which functionality is placed in a remote head, and which therefore needs to be as small as possible.

Figure 3:
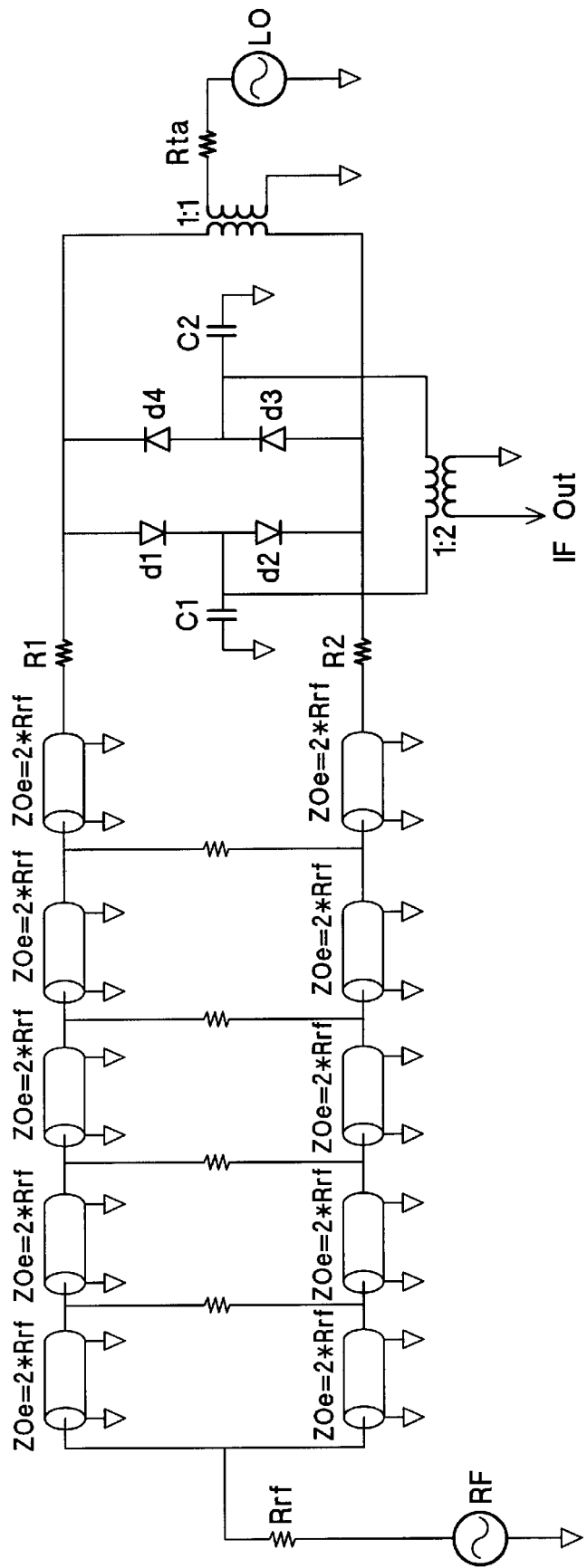
FIG. 3 schematically illustrates a mixer according to the present invention.

The preferred embodiment is schematically depicted in FIG. 3. In the preferred embodiment as shown in FIG. 3, a Wilkinson-type splitter is added between the resistors and the RF source. The even mode impedance Z0e of the splitter transmission lines is maintained at 2*Rrf (typically 100 ohms) throughout it's length. The odd mode impedance Z0o can vary along the length. The primary function of the added splitter is to increase the parallel impedance across the diodes from 2*R as in FIG. 2 to (2*R+2*Z0o) at those shorter LO wavelengths (higher frequencies) where the divider is significantly longer than a quarter wavelength.

This increased parallel impedance forces more LO current through the diodes, which means a weaker LO drive signal can be used to produce equal diode switching currents. This is important at the higher frequencies where power is very expensive. The splitter's second function is to provide a matched termination to any LO signal that makes it past the diodes and resistors R1 and R2. This reduces the LO to RF signal feedthru and maintains the high (2*R+2*Z)o) LO terminating impedance.

By maintaining the even mode transmission line impedance at 2*Rrf, the divider works properly down to zero RF frequency and has no lower limit of operation.

Figure 4:
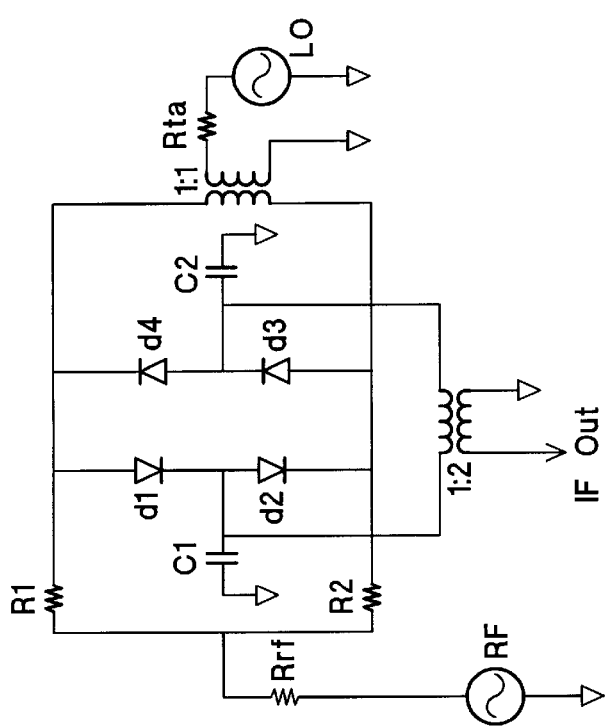
FIG. 4 schematically illustrates an alternate embodiment of the inventive mixer.

As the LO frequency drops and the splitter becomes significantly shorter than a quarter wavelength inlength, the circuit becomes the electrical equivalent of FIG. 4 and continues to function.

In an alternate embodiment of the invention, two balanced resistors replace a Wilkinson-type splitter. When R1=R2=R, the lowered impedance removes the lower frequency limit imposed by the Wilkinson-type splitter. The RF signal sees the resistors in parallel for a smaller effective series of resistance of R2 at all frequencies. The lowered resistance permits more RF energy to reach the diodes.

This invention provides broadband millimeter wave to microwave mixers, and further provides greatly extended low frequency performance. Additional configurations of the invention taught herein will be apparent to those of ordinary skill in the art, and all embodiments incorporating the principles set forth herein are intended to be encompassed in the claims set forth below.

We claim:

1. A broadband double-balanced frequency mixer for mixing a broadband RF source signal and a local oscillator signal comprising:

diode bridge switch means;

means for coupling the LO signal to the diode bridge switch means; first resistor means for splitting the RF source signal, the first resistor means having a relatively constant parallel resistance R/2 to the RF source signal and a relatively constant impedance 2*R to the LO signal in parallel with the diode bridge switch means down to zero frequency; the diode switch means mixing the RF source signal and the LO signal to form an IF signal; and means for coupling out the IF signal.

2. The mixer as in claim 1 wherein the RF source has an impedance RrF and wherein the mixer includes an RF splitter between the RF source and the first resistor means to divide the RF signal to each side of the diode means to maintain the even mode impedance at 2Rrf.

3. The mixer as in claim 2 wherein the RF splitter is a Wilkinson type splitter.

4. The mixer as in claim 3 wherein the RF splitter increases the parallel impedance across the diode means from 2R to 2R+2*Z0o.

5. The mixer as in claim 4 wherein the RF splitter provides a matched termination to the LO signal.

* * * * *